(12) United States Patent
Bocage et al.

(10) Patent No.: US 11,131,537 B2
(45) Date of Patent: Sep. 28, 2021

(54) MEASUREMENT METHOD AND ELECTRONIC MEASURING UNIT USING AN INDUCTIVE PROXIMITY SENSOR LINKED TO A CABLE

(71) Applicant: SAFRAN ELECTRONICS & DEFENSE, Paris (FR)

(72) Inventors: Frédéric Bocage, Paris (FR); Thierry Nouel De Kerangue, Paris (FR)

(73) Assignee: SAFRAN ELECTRONICS & DEFENSE, Paris (FR)

( * ) Notice: Subject to any disclaimer, the term of this patent is extended or adjusted under 35 U.S.C. 154(b) by 0 days.

(21) Appl. No.: 17/051,077

(22) PCT Filed: May 6, 2019

(86) PCT No.: PCT/EP2019/061581
§ 371 (c)(1),
(2) Date: Oct. 27, 2020

(87) PCT Pub. No.: WO2019/215098
PCT Pub. Date: Nov. 14, 2019

(65) Prior Publication Data
US 2021/0116230 A1 Apr. 22, 2021

(30) Foreign Application Priority Data
May 7, 2018 (FR) .................................... 18 53931

(51) Int. Cl.
*G01B 7/14* (2006.01)
*G01D 5/20* (2006.01)
(Continued)

(52) U.S. Cl.
CPC ............. *G01B 7/14* (2013.01); *G01D 5/2006* (2013.01); *G01R 27/2611* (2013.01); *H03K 17/954* (2013.01)

(58) Field of Classification Search
CPC ........ G01B 7/001; G01B 7/002; G01B 7/003; G01B 7/14; G01B 7/023; G01R 27/2611;
(Continued)

(56) References Cited

U.S. PATENT DOCUMENTS

5,533,400 A * 7/1996 Gasch .................... G01H 1/003
73/593
9,803,999 B2 * 10/2017 Stothers ................... G01B 7/14
(Continued)

*Primary Examiner* — Thang X Le
(74) *Attorney, Agent, or Firm* — Muncy, Geissler, Olds & Lowe, P.C.

(57) ABSTRACT

A measurement method using an inductive proximity sensor connected to a cable, the measurement method including the following steps: applying to the cable an excitation voltage at a known reference frequency; acquiring a measurement voltage representative of the excitation current that flows in the cable and in the sensor under the effect of the excitation voltage; multiplying the measurement voltage both by a first reference signal in order to obtain a first measurement signal and also by a second reference signal in order to obtain a second measurement signal; using the first measurement signal and the second measurement signal to evaluate a measurement impedance representative of the impedance of the sensor and of the cable; using the measurement impedance to estimate the inductance of the sensor or the impedance of the sensor; and comparing the inductance of the sensor or the impedance of the sensor with a predefined detection threshold in order to obtain proximity information.

12 Claims, 3 Drawing Sheets

(51) Int. Cl.
*G01R 27/26* (2006.01)
*H03K 17/95* (2006.01)

(58) Field of Classification Search
CPC ............ G01D 5/12; G01D 5/20; G01D 5/202;
G01D 5/2006; G01D 5/2046; G01D
5/2266; G01D 5/2013; G01D 5/2033;
G01D 5/2073; G01D 5/22; G01D 5/249;
G01D 5/2086
See application file for complete search history.

(56) References Cited

U.S. PATENT DOCUMENTS

| | | |
|---|---|---|
| 2003/0062891 A1 | 4/2003 | Slates |
| 2003/0214283 A1 | 11/2003 | Slates |
| 2005/0104579 A1* | 5/2005 | Slates .................... G01D 18/00 324/207.16 |
| 2006/0220655 A1* | 10/2006 | Hoyte .................... G01R 31/58 324/525 |
| 2009/0284264 A1* | 11/2009 | Ng ....................... G01R 31/083 324/525 |
| 2013/0311130 A1 | 11/2013 | Horton |
| 2014/0117979 A1* | 5/2014 | Heimlicher ........ H03K 17/9505 324/207.16 |

\* cited by examiner

MEASUREMENT METHOD AND ELECTRONIC MEASURING UNIT USING AN INDUCTIVE PROXIMITY SENSOR LINKED TO A CABLE

The invention relates to the field of measurement methods using an inductive proximity sensor connected to a cable.

BACKGROUND OF THE INVENTION

In modern aircraft, numerous systems include one or more inductive proximity sensors that are used for detecting a movement of a movable body relative to a stationary body, or else for detecting the presence or the absence of the movable body in the proximity of the stationary body. By way of example, such an inductive proximity sensor may be a linear variable differential transformer (LVDT), a rotary variable differential transformer (RVDT), a resolver, or indeed merely an on/off presence sensor.

By way of example, such systems include a system for extending and retracting landing gear, in which it is appropriate to detect in reliable manner that a landing gear door is open or closed, and that the landing gear is in its extended position or in its retracted position. Such systems also include an electric taxiing system in which it is appropriate to detect that a member for driving an aircraft wheel, e.g. a roller that is itself driven in rotation by an electric motor, is in an engaged position or a disengaged position relative to a receiver member that is constrained to rotate with the wheel.

Some such inductive proximity sensors are associated with an electronic processor unit that is "integrated" therewith. The electronic processor unit is then positioned in the same housing as the sensor, or else in the immediate proximity of the sensor. The electronic processor unit acquires and digitizes measurement signals (e.g. voltages or currents) that are produced by the sensor, and on the basis of the measurement signals and of stored predefined detection thresholds, it evaluates proximity information. By way of example, the proximity information may be the distance between a movable body and a stationary body, or it may be an on/off signal representative of the presence or the absence of the movable body.

That solution is particularly complicated to implement when the sensor needs to be positioned in an environment that is demanding, in particular in terms of temperature, vibration, impacts, electromagnetic disturbances, etc. Specifically, in such an environment, it is difficult to ensure that the electronic processor unit presents acceptable reliability.

Furthermore, it is essential to ensure that the mechanical positions of the measurement portion and of the target portion of the sensor correspond accurately to the detection thresholds stored in the electronic processor unit. It is sometimes complicated to comply with this requirement.

Other inductive proximity sensors are associated with an electronic processor unit that is "remote" therefrom. The electronic processor unit is then situated at a certain distance from the sensor, e.g. in a bay of the aircraft. The sensor is connected to the electronic processor unit by a cable. The sensor is then a sensor that is purely passive.

In order to ensure that the detection thresholds are correctly defined relative to the measurement signals, it is necessary to take account not only of the impedances of the cable and of the sensor, but also to take account of the variations of these impedances with temperature. Taking these factors into account requires calibration operations that are complicated and expensive, in particular in the event of any modification to the mechanical interfaces, and especially in the event of a modification to the length or the type of the cable being used.

OBJECT OF THE INVENTION

An object of the invention is to solve the above-mentioned problems.

SUMMARY OF THE INVENTION

In order to achieve this object, there is provided a measurement method according to claim 1.

The measurement method of the invention can be performed with a sensor connected by a cable to an electronic processor unit. It therefore does not present the drawbacks of a solution in which the electronic processor unit is integrated in the sensor.

The electronic processor unit evaluates the measurement impedance representative of the impedance of the sensor and of the cable, it estimates the inductance of the sensor or the impedance of the sensor from the measurement impedance, and it compares the inductance of the sensor or the impedance of the sensor with a predefined detection threshold in order to obtain proximity information. The electronic processor unit thus performs "automatic compensation" for compensating the effects of the impedance of the sensor and of the cable (and the effects of temperature on that impedance), and the above-mentioned calibration operations are no longer needed.

The invention also provides an electronic processor unit arranged to perform the measurement method as described above.

The invention also provides a device comprising an electronic processor unit, a cable, and an inductive proximity sensor.

The invention also provides a system for extending and retracting aircraft landing gear, the system comprising a device as specified above.

The invention also provides an electric taxiing system for an aircraft, the system comprising a device as specified above.

Other characteristics and advantages of the invention appear on reading the following description of a particular, nonlimiting embodiment of the invention.

BRIEF DESCRIPTION OF THE DRAWINGS

Reference is made to the accompanying drawings, in which.

DETAILED DESCRIPTION OF THE INVENTION

Figure 1:
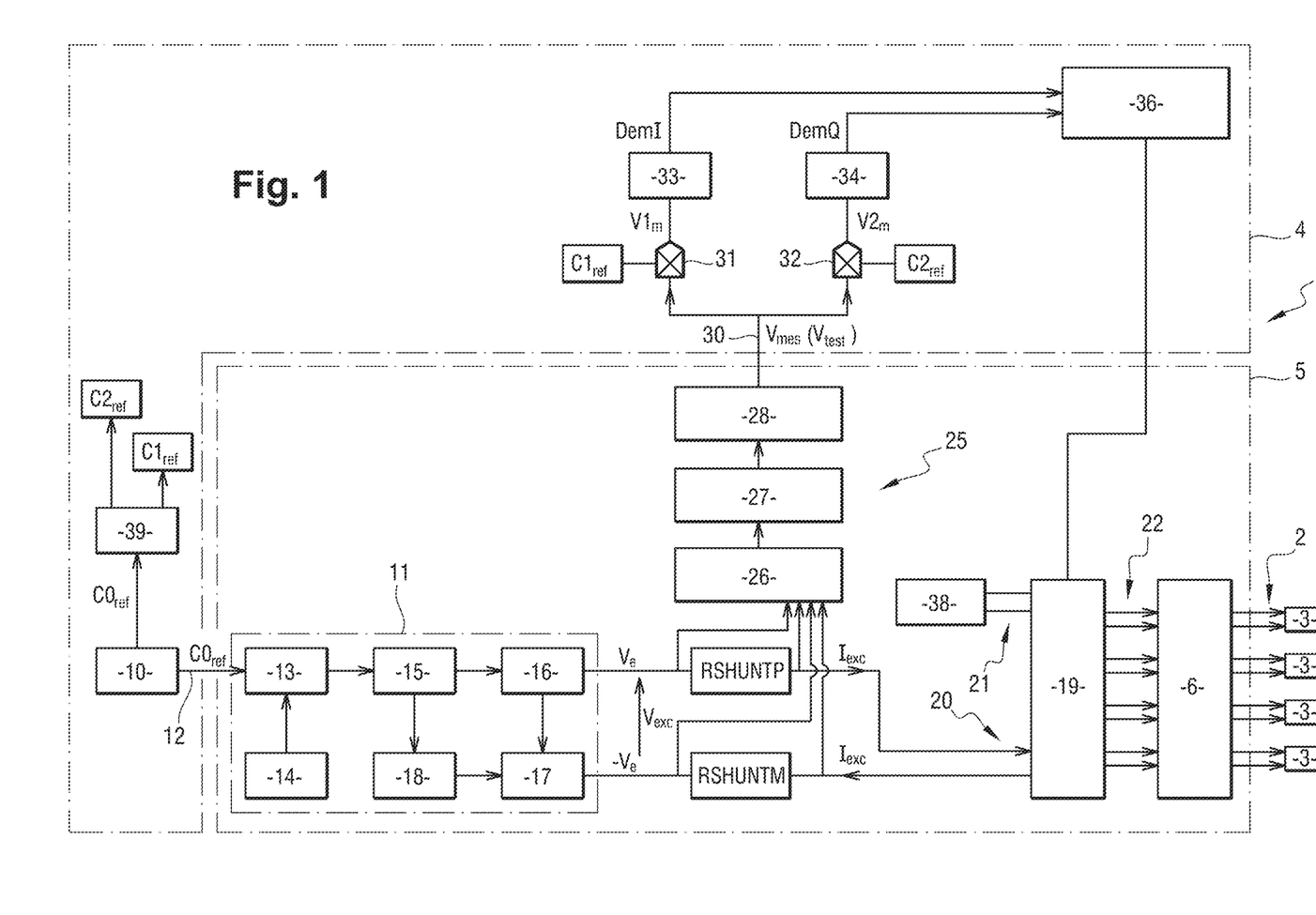
FIG. 1 is an electrical schematic of an electronic processor unit in which the measurement method of the invention is performed.

With reference to FIG. 1, the measurement method of the invention is performed in this example in an electronic processor unit 1. The electronic processor unit 1 is connected by cables 2 to a plurality of inductive proximity sensors 3.

The term "cable" is used herein to mean any electrical conductor assembly of any type and of any length. Specifically, in this example each cable 2 possesses two conductors, each conductor being connected to a respective terminal of a given sensor 3.

The electronic processor unit 1 comprises a digital portion 4 and an analog portion 5.

In this example, the digital portion 4 comprises a field programmable gate array (FPGA), however it is equally possible to use some other digital processor component: a microcontroller, a processor, an application-specific integrated circuit (ASIC), etc.

The analog portion 5 comprises a plurality of analog components that are mentioned in this description. These analog components include some that are grouped together in a "dirty box" that contains components for providing protection against lightning and against any electromagnetic disturbances that might come from the surroundings of the electronic processor unit 1, of the cables 2, and of the sensors 3, for example.

For each sensor 3, the measurement method of the invention consists initially in acquiring a measurement signal produced by the sensor 3.

The measurement signal is a current $I_{exc}$ as described below.

Acquiring the measurement signal makes it possible to estimate the inductance of the sensor or the impedance of the sensor, and by comparing the signal with a predefined detection threshold, it makes it possible to produce proximity information. The predefined detection threshold is defined by a user and it is stored in the electronic processor unit 1.

In this example, the proximity information is an on/off signal representative of the presence or the absence of a movable body in the proximity of a stationary body.

The proximity information could be different, for example it could be the distance between the movable body and the stationary body.

In this example, the predefined detection threshold serves to detect the presence or the absence of the movable body in the proximity of the stationary body. It would also be possible to have a plurality of detection thresholds in order to detect the presence or the absence of the movable body. If the looked-for information is a distance, then there would be a plurality of detection thresholds, e.g. with a given distance value being associated with a proximity measurement signal lying between two successive detection thresholds.

There follows a description of the steps that are performed in order to evaluate the inductance of the sensor or the impedance of the sensor.

The FPGA has an excitation module 10 that generates an initial reference signal presenting a known reference frequency $f_{ref}$. In this example, the reference frequency $f_{ref}$ lies in the range 500 hertz (Hz) to 3 kilohertz (kHz).

In this example, the initial reference signal is given by: $C0_{ref}=\cos(\omega_{ref} \cdot t)$.

The initial reference signal $C0_{ref}$, which is a digital signal, is transmitted via a serial peripheral interface (SPI) bus 12 to a sinewave generator block 11 forming part of the analog portion 5 of the electronic processor unit 1. The sinewave generator block comprises a digital-to-analog converter (DAC) 13, a voltage reference component 14, a filter module 15, a first amplifier module 16 (or first buffer), a second amplifier module 17 (or second buffer), and an inverter 18.

The DAC 13 produces an analog initial reference signal from the initial reference signal. The analog initial reference signal is a sinewave signal made up of "levels" associated with the precision of the DAC 13. The initial reference signal includes digital data for controlling the DAC 13.

The amplitude of the analog initial reference signal is defined by the voltage reference component 14 that produces an accurate direct current (DC) voltage reference. The analog initial reference signal is then filtered by the filter module 15. This smoothes the analog initial reference signal in order to remove the effects of digitizing "levels" in the output from the DAC 13. This reduces the harmonics present in the analog initial reference signal, which could disturb the quality of the measurement.

The first amplifier module 16 is connected directly to an output of the filter module 15, and produces a first voltage $V_e$:

$$V_e = V0 \cdot \cos(\omega_{ref} \cdot t),$$

where V0 is the gain of the sinewave generator block 11, and $\omega_{ref} = 2\pi \cdot f_{ref}$.

The second amplifier module 17 is connected to an output of the filter module 15 via the inverter 18. The second amplifier module 17 produces a second voltage $-V_e$:

$$V_e = V0 \cdot \cos(\omega_{ref} \cdot t + \pi)$$

Between the two differential outputs of the sinewave generator block 11, this thus produces an excitation voltage $V_{exc}$:

$$V_{exc} = 2 \cdot V0 \cdot \cos(\omega_{ref} \cdot t).$$

This excitation voltage is a differential voltage.

The analog portion 5 of the electronic processor unit 1 further includes two current-measurement shunts: RSHUNTP and RSHUNTM.

Each of the shunts RSHUNTP and RSHUNTM is connected in series with a respective one of the two differential outputs of the sinewave generator block 11.

The excitation voltage $V_{exc}$ is applied as input to the shunts RSHUNTP and RSHUNTM.

The outputs of the shunts RSHUNTP and RSHUNTM are connected to inputs of a selector block 19 in the analog portion 5.

The selector block 19 thus has two inputs 20 (connected to RSHUNTP and RSHUNTM), together with two test inputs 21 for a purpose that is described below. The selector block 19 also has a plurality of pairs of outputs 22, each pair of outputs 22 comprising two outputs, each connected via the dirty box 6 to a respective conductor of a corresponding cable 2, each cable being connected to a corresponding sensor 3. The selector block 19 includes measurement switches and a test switch. The measurement switches serve to select one of the sensors 3, and to connect the two outputs of the pair of outputs 22 associated with said sensor 3 to the two measurement inputs 20. It should be observed that the measurement switches may be low-cost resistive switches since, as explained below, the series resistance of the measurement switches can be ignored when evaluating the measurement impedances. The selector block 19 also includes a test switch connecting together the inputs 20 and 21. This switch must be a low-resistance switch in order to avoid having any impact on the measurement of the reference resistance 38. At any given instant, the inputs 20 are connected to a single pair of outputs 22 or else to the input 21. The positions of the switches are defined by a processor module 36 of the FPGA. The processor module 36 thus manages the measurement and test sequence.

The excitation voltage is thus applied to the inputs 20 of the selector block 19 (via the shunts RSHUNTM and RHUNTP), to the outputs of the pair of outputs 22 of the selected sensor 3, and thus to the cable 2 that connects said selected sensor 3 to the electronic processor unit 1.

Under the effect of the excitation voltage, an excitation current $I_{exc}$ flows in the cable 2 and in the sensor 3. In this example, the excitation current $I_{exc}$ is a differential current.

Figure 2:
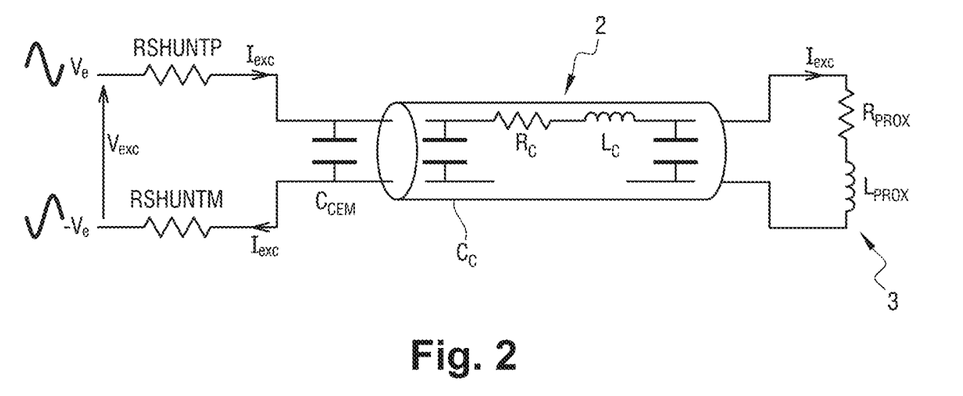
FIG. 2 shows two shunts of the electronic processor unit, a cable, and a sensor.

With reference to FIG. 2, the excitation current is given by:

$$I_{exc} = \frac{V_{exc}}{2 \cdot R_{shunt} + R_{prox} + j \cdot L_{prox} \cdot 2\pi f_{ref}} = \frac{V_{exc}}{RE + j \cdot IM} = \frac{RE - j \cdot IM}{RE^2 + IM^2} \cdot 2 \cdot V_e$$

where:
- $Rs_{hunt}$ is the resistance of each of the shunts RSHUNTP and RSHUNTM;
- $R_{prox}$ is the resistance of the sensor;
- $L_{prox}$ is the inductance of the sensor;
- RE is the real part of the measurement impedance, with $RE = 2 \cdot R_{shunt} + R_{prox}$; and
- IM is the imaginary part of the measurement impedance, with $IM = L_{prox} \cdot 2\pi \cdot f_{ref}$.

It should be observed that the inductance $L_c$ of the cable modifies the value of IM by being added to $L_{prox}$, and that the resistance $R_c$ of the cable modifies the value of RE by being added to $R_{prox}$. It should also be observed that the reference frequency $f_{ref}$ used is low enough to ensure that the capacitance $C_c$ of the cable, and also the capacitances $C_{CEM}$ of the dirty box 6 (not shown in FIG. 1) are negligible when estimating the measurement impedance.

Figure 3:
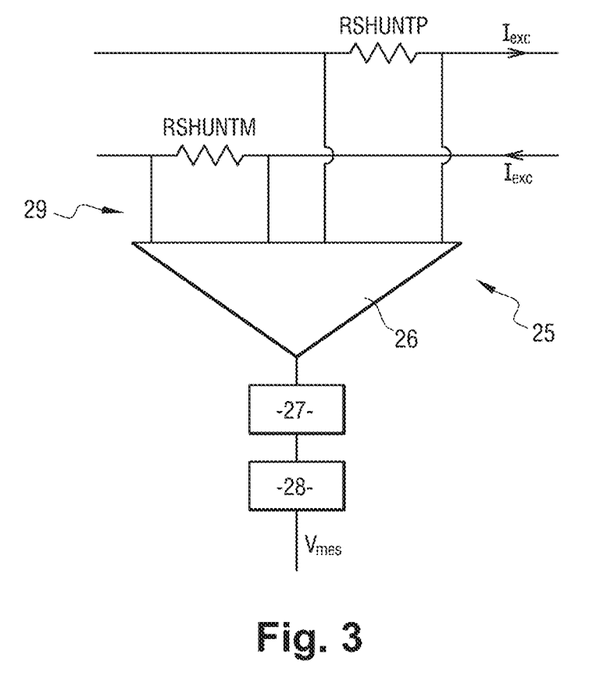
FIG. 3 shows an acquisition circuit of the electronic processor unit.

With reference to FIG. 3, the analog portion 5 of the electronic processor unit 1 includes an acquisition circuit 25 for acquiring the excitation current $I_{exc}$. The acquisition circuit 25 comprises the shunts RSHUNTP and RSHUNTM, together with a differential amplifier 26, an anti-aliasing filter 27, and an analog-to-digital converter (ADC) 28. The differential amplifier 26 has two pairs of inputs 29, each input of a given pair of inputs 29 being connected to a terminal of a corresponding one of the shunts RSHUNTP and RSHUNTM. The output of the differential amplifier 26 is connected to the input of the ADC 28 via the anti-aliasing filter 27. The sampling frequency $f_{ech}$ of the ADC 28 is a multiple of the reference frequency $f_{ref}$ (in this example, $f_{ech} = 72 \cdot f_{ref}$). This sampling frequency is usually the same as the sampling frequency of the DAC 13, and thus of the initial reference signal.

The excitation current is acquired, digitized by the acquisition circuit 25, and transformed into a digital measurement voltage $V_{mes}$ representative of the excitation current Iexc. The measurement voltage $V_{mes}$ is then transmitted to the FPGA via an SPI bus.

The measurement voltage $V_{mes}$ is such that:

$$V_{mes} = K \cdot 2 \cdot V0 \cdot \cos(\omega t + \phi) \cdot \frac{RE}{RE^2 + IM^2} + K \cdot 2 \cdot V0 \cdot \sin(\omega t + \phi) \cdot \frac{IM}{RE^2 + IM^2};$$

where:
- $\phi$ is an acquisition phase shift caused by the entire acquisition chain comprising the selector block 19, the dirty box 6, the acquisition circuit 25, the cable 2, and the sensor 3;
- $\omega = 2 \cdot \pi \cdot f_{ref} = \omega_{ref}$; and
- K is the gain of the acquisition circuit 25.

The FPGA also includes a first multiplier 31 and a second multiplier 32.

On each step of sampling of the measurement voltage $V_{mes}$, the first multiplier 31 multiplies the measurement voltage by a first reference signal $C1_{ref}$ in order to obtain a first measurement signal.

The frequency of the first reference signal $C1_{ref}$ is the reference frequency and it is obtained from the initial reference signal $C0_{ref}$.

The first reference signal is such that:

$$C1_{ref} = K_{ref} \cos(\omega_{ref} t).$$

The second multiplier 32 multiplies the measurement voltage by a second reference signal $C2_{ref}$ in order to obtain a second measurement signal.

The frequency of the second reference signal $C2_{ref}$ is the reference frequency and it is in phase quadrature with the first reference signal $C1_{ref}$. The second reference signal is such that:

$$C2_{ref} = K_{ref} \sin(\omega_{ref} t);$$

The first measurement signal $V1_m$ is thus such that:

$$V1_m = V_{mes} \cdot K_{ref} \cos(\omega_{ref} t);$$

and thus:

$$V1_m = \frac{K_{ref} \cdot K \cdot A \cdot 2 \cdot V0}{2} \cdot [\cos(\phi) + \cos(2\omega t + \phi)] + \frac{K_{ref} \cdot K \cdot B \cdot 2 \cdot V0}{2} \cdot [\sin(\phi) + \sin(2\omega t + \phi)].$$

The second measurement signal $V2_m$ is thus such that:

$$V2_m = V_{mes} \cdot K_{ref} \sin(\omega_{ref} t);$$

and thus:

$$V2_m = \frac{K_{ref} \cdot K \cdot A \cdot 2 \cdot V0}{2} \cdot [\sin(\phi) + \sin(2\omega t + \phi)] + \frac{K_{ref} \cdot K \cdot B \cdot 2 \cdot V0}{2} \cdot [\cos(\phi) + \cos(2\omega t + \phi)],$$

where:

$$A = \frac{RE}{RE^2 + IM^2};$$

$$B = \frac{IM}{RE^2 + IM^2}.$$

It should be observed that the internal implementation of the FPGA may operate in floating point or in fixed point, depending on requirements. The above equations are written as though they were "continuous", however the processing is indeed performed on each step of sampling the measurement voltage $V_{mes}$.

Thereafter, a first DC component DemI is obtained by averaging the first measurement signal $V1_m$ using a first integrator 33, and a second DC component DemQ is obtained by averaging the second measurement signal $V2_m$ using a second integrator 34. Each of the first and second integrators 33 and 34 integrates over one reference period (reciprocal of the reference frequency). Response time is thus well-controlled. Instead of using the first integrator 33 and the second integrator 34, it would be possible to use digital lowpass filters in order to average the first measurement signal and the second measurement signal.

The terms in $\cos(2\omega t+\phi)$ and in $\sin(2\omega t+\phi)$ cancel under the effect of the integration, as applies to any cosine or sine function that is integrated over an integration period that is equal to a multiple of its own period.

The first DC component DemI is such that:

$$DemI = \frac{V_{mes} \cdot C1_{ref}}{K_{ref} \cdot 2 \cdot V0} = \frac{K \cdot A}{2} \cdot \cos(\phi) + \frac{K \cdot B}{2} \cdot \sin(\phi)$$

The second DC component DemQ is such that:

$$DemQ = \frac{V_{mes} \cdot C2_{ref}}{K_{ref} \cdot 2 \cdot V0} = \frac{K \cdot A}{2} \cdot \sin(\phi) + \frac{K \cdot B}{2} \cdot \cos(\phi).$$

Initially it is assumed that the acquisition phase shift ($\phi$), as caused by the acquisition chain, is zero.

The processor module 36 of the FPGA then acquires the first DC component DemI and the second DC component DemQ.

The processor module 36 calculates a real part and an imaginary part of the measurement impedance from the first DC component and from the second DC component:

$$RE = \frac{K \cdot (2 \cdot DemI)}{(2 \cdot DemI)^2 + (2 \cdot DemQ)^2} \text{ and}$$

$$IM = \frac{K \cdot (2 \cdot DemQ)}{(2 \cdot DemI)^2 + (2 \cdot DemQ)^2}.$$

The real part and the imaginary part of the measurement impedance are then used to obtain the resistance $R_{prox}$ of the sensor and the inductance $L_{prox}$ of the sensor:

$$R_{prox} = RE - 2 \cdot R_{shunt} - R_c \text{ and}$$

$$L_{prox} = \frac{IM}{2 \cdot \pi \cdot f_{ref}} - L_c$$

In these equations, the resistance $R_c$ of the cable and the inductance $L_c$ of the cable are integrated.

Knowledge about the nature of the cable 2 and/or about its mean length thus makes it possible to improve the accuracy with which the inductance of the sensor 3 is measured by correcting it as a function of the inductance of the cable 2. This correction need not necessarily be made, with performance of the correction depending on the required accuracy of measurement.

In the event of the cable 2 being changed, the system can be re-adjusted by modifying only one parameter (e.g. a software parameter or indeed an FPGA parameter processed by the FPGA) that relates to the cable (its type, its length, its impedance, etc.).

The value of the inductance $L_{prox}$ of the sensor is then compared with the detection threshold in order to obtain the proximity information. Instead of working with the inductance $L_{prox}$ of the sensor, it would also be possible to work with its impedance ($L_{prox} \cdot \omega_{ref}$). Specifically, the detection threshold may be defined in terms of impedance rather than inductance since the reference frequency is known and under control.

Naturally, there is no need to subtract the resistance $R_c$ and the inductance $L_c$ of the cable. It is also possible to adapt the detection threshold by making use directly of the real part and/or the imaginary part of the measurement impedance.

It is assumed above that the acquisition phase shift (1), as caused by the acquisition chain, is zero. However, as a general rule, the acquisition phase shift $\phi$ is not zero. The measurement method thus includes a test step for the purpose of estimating the acquisition phase shift.

The test step makes use of a test load positioned in the analog portion 5 of the electronic processor unit 1. The test load presents a test impedance that is known, with an imaginary part or a real part that is zero. In this example, it is the imaginary part of the test load that is zero.

Figure 4:
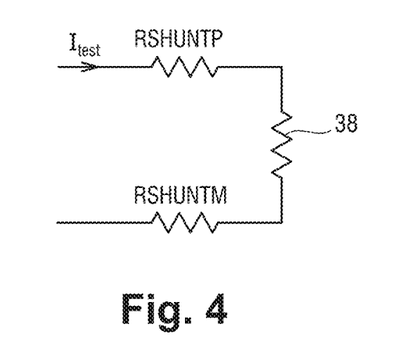
FIG. 4 shows a reference load and the two shunts.

With reference to FIG. 4, in this example, the test load is a test resistance 38. The test resistance 38 is connected to the test inputs 21 of the selector block 19.

When it is appropriate to perform the test step, the test switch of the selector block 19 connects the test resistance 38 between the two shunts RSHUNTP and RSHUNTM.

The test step is performed as follows.

The excitation voltage $V_{exc}$ is applied to the test resistance 38. A test current $I_{test}$ flows through the test resistance under the effect of the excitation voltage. The test current is acquired, digitized by the acquisition circuit 25, and transformed into a digital test voltage $V_{test}$ representative of the test current.

The test voltage $V_{test}$ is multiplied by the first reference signal in order to obtain a first test signal and by the second reference signal in order to obtain a second test signal.

Thereafter, a first DC component DemI is obtained by averaging the first test signal using a first integrator 33, and a second DC component DemQ is obtained by averaging the second test signal using a second integrator 34.

This gives:

$$DemI = \frac{V_{test} \cdot C1_{ref}}{K_{ref} \cdot 2 \cdot V0} = \frac{K \cdot A}{2} \cdot \cos(\phi) + \frac{K \cdot B}{2} \cdot \sin(\phi)$$

$$DemQ = \frac{V_{test} \cdot C2_{ref}}{K_{ref} \cdot 2 \cdot V0} = \frac{K \cdot A}{2} \cdot \sin(\phi) + \frac{K \cdot B}{2} \cdot \cos(\phi),$$

where $\phi$ is the acquisition phase.

Since the imaginary part of the test resistance 38 is zero, B=0.

Thus:

$$DemI = \frac{V_{test} \cdot C1_{ref}}{K_{ref} \cdot 2 \cdot V0} = \frac{K \cdot A}{2} \cdot \cos(\phi)$$

$$DemQ = \frac{V_{test} \cdot C2_{ref}}{K_{ref} \cdot 2 \cdot V0} = \frac{K \cdot A}{2} \cdot \sin(\phi).$$

$\phi$ is evaluated as follows:

$$\phi(\text{rad}) = \arctan\left(\frac{DemQ}{DemI}\right)$$

In order to simplify calculations internal to the FPGA, the arctan function may be replaced by a polynomial function, e.g. by a third order Taylor expansion, particularly since the acquisition phase shift caused by an analog acquisition chain is generally small.

The acquisition phase shift corresponds to a delay τ:

$$\tau = \frac{\phi}{2 \cdot \pi \cdot f_{ref}}.$$

Thus, instead of performing a complex calculation on demodulation, use is made of a delay module 39 connected to an output of the excitation module 10. The delay module 39 subjects the initial reference signal to a reference delay, equal to the delay τ, in order to obtain the first reference signal and the second reference signal. In contrast, the measurement voltage $V_{mes}$ is not subjected to this delay τ.

The reference delay thus serves to compensate the acquisition phase shift.

The test step is then reiterated, the first reference signal and the second reference signal being delayed by the reference delay.

It is verified that the imaginary part of the impedance of the test resistance 38 as estimated by the acquisition chain is indeed zero.

The following should thus be obtained:

$$R_{test} = \frac{K \cdot (2 \cdot DemI)}{(2 \cdot DemI)^2 + (2 \cdot DemQ)^2} = \frac{K}{2 \cdot DemI} \text{ and}$$

$$L_{test} = \frac{K \cdot (2 \cdot DemQ)}{(2 \cdot DemI)^2 + (2 \cdot DemQ)^2} = 0.$$

Measuring the resistance $R_{test}$ also makes it possible to correct gain error (or to correct unusual drift in the value of the test resistance 38). Gain error is corrected by using the following equation:

$$KG = \frac{Rmesuré}{RSHUNTP + RSHUNTM + R_{test}}$$

Because of the ratiometric calculation of RE and IM, gain error does not involve the output amplitude from the sinewave generator block 11, nor does it involve the amplitude of the first reference signal or of the second reference signal internal to the FPGA.

The electronic processor unit 1 thus automatically compensates (or automatically controls) the phase shift and the gain of the acquisition chain.

Figure 5:
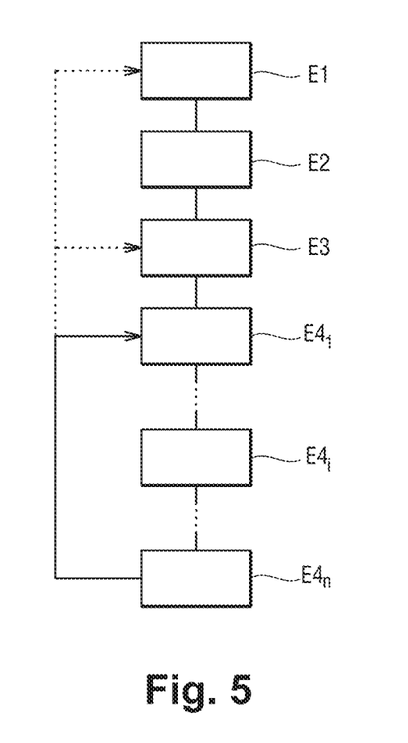
FIG. 5 is a diagram showing the steps of the measurement method of the invention.

With reference to FIG. 5, performance of the measurement method of the invention is summarized for a plurality of sensors.

The measurement method begins with a first test step E1 for estimating the acquisition phase shift, while the first reference signal and the second reference signal do not present any phase shift.

Thereafter, a phase-shifting step E2 is performed. The phase-shifting step E2 consists in applying a reference delay to the first reference signal and to the second reference signal in order to compensate the acquisition phase shift. Gain is also compensated.

Thereafter, the measurement method includes a second test step E3, while the first reference signal and the second reference signal are delayed by the reference delay. The second test step serves to check that the compensation is effective by verifying that the imaginary part of the impedance of the reference resistance 38 as estimated by the acquisition chain is indeed zero. Naturally, if the reference load has an impedance with a zero real part, then during the second test step, it should be verified that the estimated real part of the impedance of the reference load is indeed zero.

Thereafter, for each sensor $3_i$, impedance evaluation steps $E4_i$ are performed (where the index i varies from 1 to n, where n is the number of sensors 3). The evaluation steps serve to evaluate the inductance of the sensor or the impedance of the sensor in order to compare it with the detection threshold associated with the sensor as a function of the measurement impedance.

For each sensor $3_i$, the evaluation steps are repeated as often as necessary.

It should be observed that the test load may also be used for checking the validity of the proximity measurement signal on a non-inductive reference load as a built-in test (BITE). This is particularly useful if the phase and gain compensations of the acquisition chain are fixed (design-based).

Naturally, the invention is not limited to the embodiment described, but covers any variant coming within the ambit of the invention as defined by the claims.

The excitation voltage need not necessarily be a differential voltage. It is possible to use a common mode voltage. A common mode solution is poorer in terms of noise rejection, but it is less expensive and its components can occupy a smaller area.

It is entirely possible to perform the measurement method of the invention using sensors in common mode. A single shunt would then be used connected to one conductor of the cable, the second conductor of the cable being connected to ground.

The invention claimed is:

1. A measurement method using an inductive proximity sensor connected to a cable, the measurement method comprising the following impedance-evaluation steps:

applying to the cable an excitation voltage at a known reference frequency ($f_{ref}$);

acquiring a measurement voltage representative of the excitation current ($I_{exc}$) that flows in the cable and in the sensor under the effect of the excitation voltage;

multiplying the measurement voltage both by a first reference signal in order to obtain a first measurement signal and also by a second reference signal in order to obtain a second measurement signal, the first reference signal being at the reference frequency, and the second reference signal being at the reference frequency and being in phase quadrature with the first reference signal;

using the first measurement signal and the second measurement signal to evaluate a measurement impedance representative of the impedance of the sensor and of the cable;

using the measurement impedance to estimate the inductance of the sensor or the impedance of the sensor; and comparing the inductance of the sensor or the impedance of the sensor with a predefined detection threshold in order to obtain proximity information;

the measurement method further comprising a test step comprising steps of applying the excitation voltage to a test load presenting a known test impedance in which an imaginary part or a real part is zero, and of acquiring a test voltage representative of a test current that flows in the test load under the effect of the excitation voltage.

2. The measurement method according to claim 1, wherein the first measurement signal is averaged in order to obtain a first DC component, the second measurement signal is averaged in order to obtain a second DC component, and wherein the real part and the imaginary part of the measurement impedance are obtained from the first DC component and from the second DC component.

3. The measurement method according to claim 1, wherein the excitation voltage is a differential voltage applied to two conductors of the cable.

4. The measurement method according to claim 1, wherein the test voltage is multiplied both by the first reference signal in order to obtain a first test signal and also by the second reference signal in order to obtain a second test signal.

5. The measurement method according to claim 4, wherein the first test signal and the second test signal are used to check the validity of the proximity information.

6. The measurement method according to claim 4, wherein the first test signal and the second test signal are used to estimate the acquisition phase shift produced by an acquisition chain connected to the cable.

7. The measurement method according to claim 6, further comprising a phase-shifting step consisting in applying a reference delay to the first reference signal and to the second reference signal in order to compensate the acquisition phase shift.

8. The measurement method according to claim 7, wherein the following are performed in succession:
   a first test step for estimating the acquisition phase shift, while the first reference signal and the second reference signal are not delayed;
   a phase-shifting step for applying a reference delay to the first reference signal and to the second reference signal in order to compensate the acquisition phase shift;
   a second test step while the first reference signal and the second reference signal are delayed by the reference delay, the second test step serving to check that the compensation is effective by verifying that the imaginary part or the real part of the impedance of the reference load, as estimated via the acquisition chain, is indeed zero; and
   impedance evaluation steps for evaluating the inductance of the sensor or the impedance of the sensor in order to compare it with the detection threshold associated with the sensor as a function of the measurement impedance.

9. An electronic processor unit in which a measurement method according to claim 1 is performed.

10. A device comprising an electronic processor unit according to claim 9, the cable, and the inductive proximity sensor.

11. A system for extending and retracting aircraft landing gear, the system comprising the device according to claim 10.

12. An electric taxiing system for an aircraft, the system comprising the device according to claim 10.

* * * * *